United States Patent
Ho

(10) Patent No.: US 7,656,199 B2
(45) Date of Patent: Feb. 2, 2010

(54) FAST, LOW OFFSET GROUND SENSING COMPARATOR

(75) Inventor: Daniel Ho, Palo Alto, CA (US)

(73) Assignee: VIA Technologies, Inc. (TW)

( * ) Notice: Subject to any disclaimer, the term of this patent is extended or adjusted under 35 U.S.C. 154(b) by 0 days.

(21) Appl. No.: 12/359,737

(22) Filed: Jan. 26, 2009

(65) Prior Publication Data
US 2009/0128193 A1 May 21, 2009

Related U.S. Application Data

(63) Continuation of application No. 11/421,540, filed on Jun. 1, 2006, now Pat. No. 7,514,966.

(60) Provisional application No. 60/595,056, filed on Jun. 2, 2005.

(51) Int. Cl.
*H03K 5/22* (2006.01)
(52) U.S. Cl. .............................. 327/66; 327/53; 327/57; 327/63; 327/65
(58) Field of Classification Search .................... 327/52, 327/53, 58, 60, 62, 63, 65–69, 71, 72, 74, 327/77–81, 88, 89, 96, 127, 246, 266, 274, 327/280, 287, 359, 560–563; 326/62, 63, 326/68, 80, 81; 365/189
See application file for complete search history.

(56) References Cited

U.S. PATENT DOCUMENTS

| | | |
|---|---|---|
| 5,196,737 A | 3/1993 | Olmstead |
| 5,287,068 A | 2/1994 | Olmstead et al. |
| 5,541,538 A | 7/1996 | Bacrania et al. |
| 5,714,906 A | 2/1998 | Motamed et al. |
| 6,133,764 A | 10/2000 | Griffith et al. |
| 6,246,220 B1 | 6/2001 | Isham et al. |
| 6,621,256 B2 | 9/2003 | Muratov et al. |
| 6,661,210 B2 | 12/2003 | Kimball et al. |

(Continued)

OTHER PUBLICATIONS

Wikipedia—Voltage, http://en.wikipedia.org/wiki/voltage.

(Continued)

*Primary Examiner*—Lincoln Donovan
*Assistant Examiner*—Brandon S Cole
(74) *Attorney, Agent, or Firm*—James W. Huffman

(57) ABSTRACT

A fast, accurate, low offset comparator may be configured with multiple gain stages. A low gain, low input impedance, and fully differential common-gate amplifier may be configured as a first stage in the multi-stage comparator, providing a wide bandwidth for small power consumption. The inputs of the comparator may comprise a pair of differential inputs at respective source terminals of gate-coupled metal oxide semiconductor (MOS) devices configured in the input stage of the common-gate amplifier. A pair of differential outputs of the first stage may be coupled to a pair of differential inputs of a second stage, which may be a differential input current-mirror amplifier that may perform differential to single-ended conversion. The single-ended output of the second stage may serve as the input into a latch, which may be a bistable set-reset (SR) latch configured to increase the gain and response time while protecting against multiple switching, with the single-ended output of the latch configured as the output of the comparator.

12 Claims, 5 Drawing Sheets

U.S. PATENT DOCUMENTS

| | | |
|---|---|---|
| 6,670,794 B1 | 12/2003 | Wang et al. |
| RE38,487 E | 4/2004 | Isham et al. |
| 6,815,936 B2 | 11/2004 | Wiktor et al. |
| 9,066,400 | 3/2006 | Kang et al. |
| 7,205,837 B2 | 4/2007 | Cohen |
| 2002/0039049 A1 | 4/2002 | Minegishi |
| 2003/0039049 A1* | 2/2003 | Shi .............................. 360/65 |
| 2004/0085098 A1 | 5/2004 | Kajimoto |
| 2007/0013427 A1 | 1/2007 | Nomura |

OTHER PUBLICATIONS

Wikipedia—Comparator, http://en.wikipedia.org/wiki/Comparator.

* cited by examiner

FAST, LOW OFFSET GROUND SENSING COMPARATOR

CROSS-REFERENCE TO RELATED APPLICATIONS

This application is a continuation of U.S. patent application Ser. No. 11/421,540, filed on Jun. 1, 2006 now U.S. Pat. No. 7,514,966. U.S. application Ser. No. 11/421,540 claims the benefit of U.S. Provisional Application Ser. No. 60/595,056, filed on Jun. 2, 2005, which is herein incorporated by reference for all intents and purposes.

BACKGROUND OF THE INVENTION

1. Field of the Invention

This invention relates to voltage comparators, and more particularly to designing fast comparators that can accurately compare signals to ground level.

2. Description of the Related Art

Comparators are devices that typically compare two voltages or two currents, switching their respective outputs to indicate which of the two input signals is larger. Oftentimes comparators are analog circuits used in a variety of applications. One implementation of comparators may be directed towards detecting the level of an input signal relative to a zero-level voltage, or ground, in switching power regulators operating in a PFM (pulse-frequency-modulation) mode. Many different types of comparators exist, each with different advantages and disadvantages. Open loop, uncompensated two-stage operational amplifier (op-amp) based comparators implemented with PMOS (P-channel Metal Oxide Semiconductor) input devices are capable of sensing ground level, typically have a high gain, but may be rather slow when consuming low power.[1] Generally, PMOS input, cross-coupled comparators have a high offset and feature a low gain, but are not suitable for sensing near zero-level (ground) voltages.

[1] Philip Allen, "CMOS Analog Circuit Design", chapter 7. Oxford, 1987

One type of comparator that may typically be used for sensing ground within a switching power regulator features a PMOS input, gain-enhanced current-mirror configuration. One example of such a comparator (100) is shown in FIG. 1. Comparator 100 is implemented with source-coupled differential input pair PMOS devices 102 and 104 receiving current from current source 128, with positive feedback to provide a high gain and increase response time. Surprisingly, comparator 100 shows a relatively low gain in simulation. When configured to sense ground (or zero voltage), input $V_{in-}$ 122 may be coupled to a zero volt (ground) reference. If $V_{in+}$ 124 is below ground level, for example at −10 mV, and $V_{GS[102]}$ (the gate-source voltage of PMOS device 102) is at 1V, then because of $V_{in-}$ 122 residing at a zero volt level, the voltage at node A would be at 1V, with $V_{DS[102]}$ (the drain-source voltage of PMOS device 102) following the voltage at node A. In general, PMOS devices 102 and 104 would not be in saturation, resulting in a very low DC gain of the first stage. A low DC gain would in turn lead to comparator 100 having a high offset and operating with low efficiency.

Many other problems and disadvantages of the prior art will become apparent to one skilled in the art after comparing such prior art with the present invention as described herein.

SUMMARY OF THE INVENTION

In one set of embodiments, a fast, accurate, low offset comparator may be configured with multiple stages. A low gain, low input impedance, and fully differential common-gate amplifier may be configured as a first stage in the multi-stage comparator, providing a wide bandwidth for small power consumption. The first stage may be coupled to a second stage comprising a differential input current-mirror amplifier, which may perform differential to single-ended conversion. The single-ended output of the second stage may serve as the input into a latch, which may be a bistable set-reset (SR) latch configured to increase the gain and response time while protecting against multiple switching, with the output of the latch serving as the output of the comparator.

The multi-stage comparator may achieve a high power-to-speed ratio and low offset by providing a current input into the first stage, in which the respective source terminals of two gate-coupled NMOS devices may be configured as the pair of differential inputs corresponding to the inputs of the comparator. In some embodiments, the power-to-speed ratio may thereby be improved by at least a factor of 5, with no large voltage swings on at least the internal nodes of the first stage. Overall gain of the comparator may be increased by configuring multiple gain stages—e.g. two or more stages—that may comprise a series cascade of low gain stages capable of providing a broader bandwidth than a single stage with an equivalent gain. For example, a three-stage, 10×10×10 gain may facilitate the design of a comparator with a broader bandwidth than one with a single stage gain of 1000. The resulting comparator may be configured in a switching power regulator, where it may be disabled when the opposite switch (PMOS) is enabled. Furthermore, the comparator may operate with fast response times, a small offset, and low quiescent current, with protection against multiple switching.

BRIEF DESCRIPTION OF THE DRAWINGS

The foregoing, as well as other objects, features, and advantages of this invention may be more completely understood by reference to the following detailed description when read together with the accompanying drawings in which.

Figure 1:
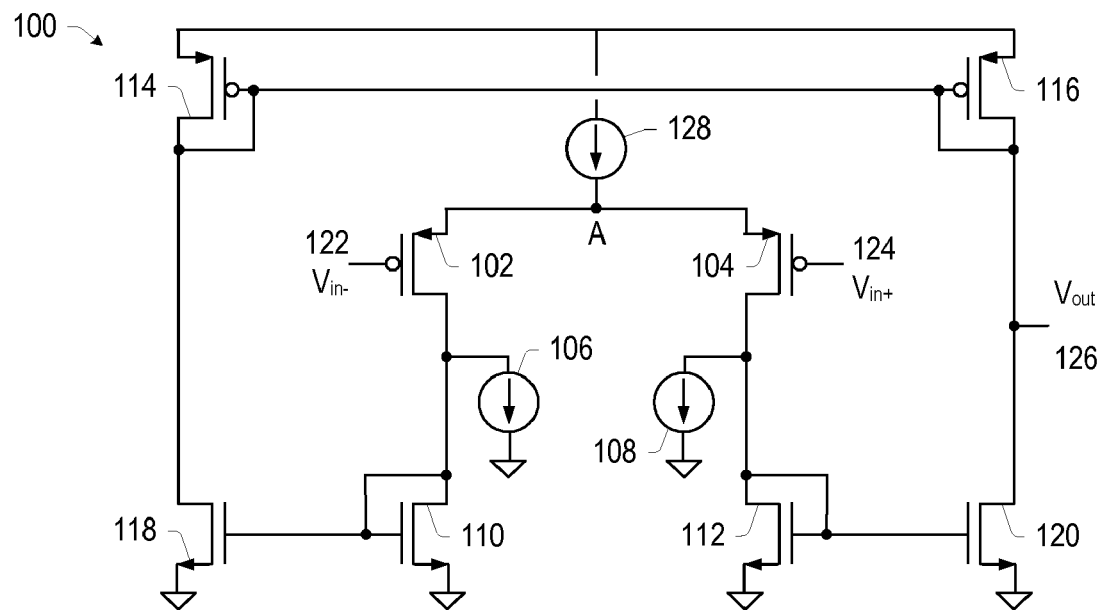
FIG. 1 shows one embodiment of a prior art comparator typically used in switching regulators to sense ground.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)."

DETAILED DESCRIPTION

As used herein, a "pair of differential inputs" refers to a pair of inputs configured as a differential input pair, and a "pair of differential outputs" refers to a pair of outputs configured as a differential output pair. For example, a differential amplifier may have a pair of differential inputs and a pair of differential outputs, with the pair of differential inputs comprising a $V_{in+}$ and a $V_{in-}$ input, and similarly, a pair of differential outputs comprising a $V_{out+}$ and a $V_{out-}$ output. A "single-ended output" refers to a single output as opposed to a pair of differential outputs. A "diode-connected transistor" refers to a transistor having its control terminal (e.g. a gate terminal for MOS devices) coupled to its input terminal (e.g. a drain terminal for MOS devices).

Figure 2:
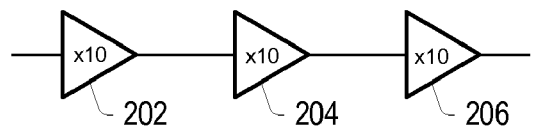
FIG. 2 shows multiple gain stages coupled to obtain a high overall gain.

A fast, accurate and low offset comparator capable of sensing ground level may be configured with multiple gain stages. In one set of embodiments, the first gain stage may be a low gain, low input-impedance common-gate amplifier. FIG. 2 shows a cascading series of low-gain stages, which may be implemented to obtain a high overall gain with a broader overall bandwidth than what may be achieved with a single stage of equivalent gain. For example, three gain stages 202, 204, and 206—each having a gain of 10—may be cascaded as shown in FIG. 2, obtaining a gain of 10×10×10 (=1000), but with broader bandwidth than a single stage having a gain of 1000. The use of multiple gain stages may also make it easier to implement each stage, as the demands for each stage, e.g. gain, speed and bandwidth of the individual stage, may be less difficult to meet than the equivalent compound requirements may be for a single stage. Various embodiments of comparators designed according to principles of the present invention may comprise two or more gain stages.

Figure 3:
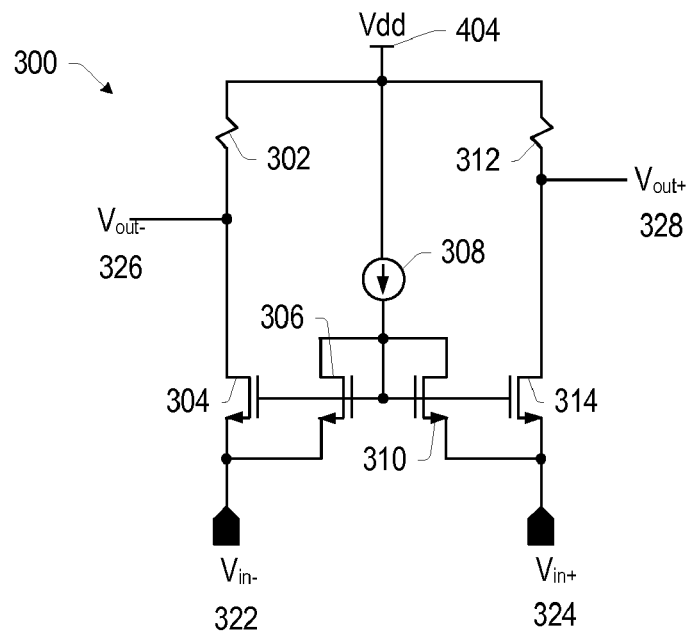
FIG. 3 shows the first gain stage of one embodiment of a comparator according to principles of the present invention.

One embodiment of a first gain stage 300 is shown in FIG. 3. Gain stage 300 may be implemented as a low gain, low input-impedance, differential, common-gate amplifier. NMOS devices 306 and 310 may each be coupled as diodes (the drain and the gate of the transistor may be coupled together, resulting in the transistor operating in the constant current region), with their respective gates coupled to each other and to current source 308. Current source 308 may operate to source current to NMOS devices 306 and 310. The source terminals of NMOS devices 306 and 310 may respectively be coupled to the source terminals of NMOS devices 304 and 314, with the commonly coupled gate terminals of NMOS devices 306 and 310 respectively coupled to the gate terminals of NMOS devices 304 and 314, as shown. The coupled source terminals of NMOS devices 304 and 306, and the coupled source terminals of NMOS devices 310 and 314 may be configured as differential inputs $V_{in-}$ 322 and $V_{in+}$ 324, respectively, of first gain stage 300, and may therefore serve as the pair of differential inputs for any comparator comprising first gain stage 300.

$V_{in-}$ 322 and $V_{in+}$ 324 may operate to modulate the gate-source voltage ($V_{GS}$) of NMOS devices 304, 306, 310, and 314 by modifying their respective source voltages. For example, when differential input voltage [$V_{in-}$ 322, $V_{in+}$ 324] (that is, the difference between $V_{in-}$ 322 and $V_{in+}$ 324) reaches a value causing NMOS device 306 to turn on, a multiple of the forced current provided by current source 308 and conducted by NMOS device 306 may be mirrored in NMOS device 304, depending on the size ratio of NMOS device 306 to NMOS device 304. If, for example, the ratio of NMOS device 306 to NMOS device 304 is 1:1, the current conducted by NMOS device 306 may be mirrored in NMOS device 304 under the conditions described above. Similarly, when differential input voltage [$V_{in-}$ 322, $V_{in+}$ 324] reaches a value causing NMOS device 310 to turn on, a multiple of the forced current provided by current source 308 and conducted by NMOS device 310 may be mirrored in NMOS device 314, depending on the size ratio of NMOS device 310 to NMOS device 314.

With NMOS device 304 turned on, load resistor 302 (in alternate embodiments, load devices other than resistors, e.g. transistors, may be used) may conduct the current mirrored from NMOS device 306, which, as previously mentioned, may be a multiple of the current conducted by NMOS device 306. As a result, $V_{out-}$ 326 of the pair of differential outputs of first gain stage 300 may get closer to the value of $V_{in-}$ 322, and $V_{out+}$ 328 may get closer to the value of supply voltage Vdd 404, leading to a large voltage difference between the pair of differential voltage outputs $V_{out-}$ 326 and $V_{out-}$ 328. Similarly, with NMOS device 314 turned on, load resistor 312 may conduct the current mirrored from NMOS device 310, which may be a multiple of the current conducted by NMOS device 310. As a result, $V_{out+}$ 328 may get closer to the value of $V_{in+}$ 324, and $V_{out-}$ 326 may get closer to the value of supply voltage Vdd 404, leading to a large voltage difference between the pair of differential voltage outputs $V_{out-}$ 326 and $V_{out+}$ 328 that is opposite in polarity to the similarly developed large voltage difference developed when current flows in load resistor 302.

By providing a forced input current through the common node coupling together the gate and drain terminals of NMOS devices 306 and 310, and configuring the respective source terminals of NMOS devices 306 and 310 as the differential voltage inputs, the power/speed ratio may be greatly improved, e.g. by a factor of 5 in some embodiments. In addition, large voltage swings at internal nodes of first gain stage 300 may be eliminated. While first gain stage 300 may be implemented to have a low-gain and wide bandwidth for small power consumption, by cascading a series of low-gain stages (as shown in FIG. 2), a sufficient overall gain for the comparator may be achieved. The DC (direct current) gain of first gain stage 300 may be expressed as $$\text{DC gain} = gm_{304} * (R \| rds_{304}), \quad (1)$$

where '$gm_{304}$' is the transconductance of NMOS device 304, and ($R \| rds_{304}$) represents the overall parallel resistance of resistor 302 and the small signal resistance of NMOS device 304 operating in the saturation region. In other words, ($R \| rds_{304}$) is the effective equivalent impedance seen at the drain of NMOS device 304. The gain is similar to the gain of the common-source amplifier shown in FIG. 1. However, since the differential inputs in first gain stage 300 are applied at the source terminals of the common-gate amplifier (as opposed to being applied at the gate terminals of a common-source transistor structure), the sign of the gain will be positive rather than negative.

Figure 4:
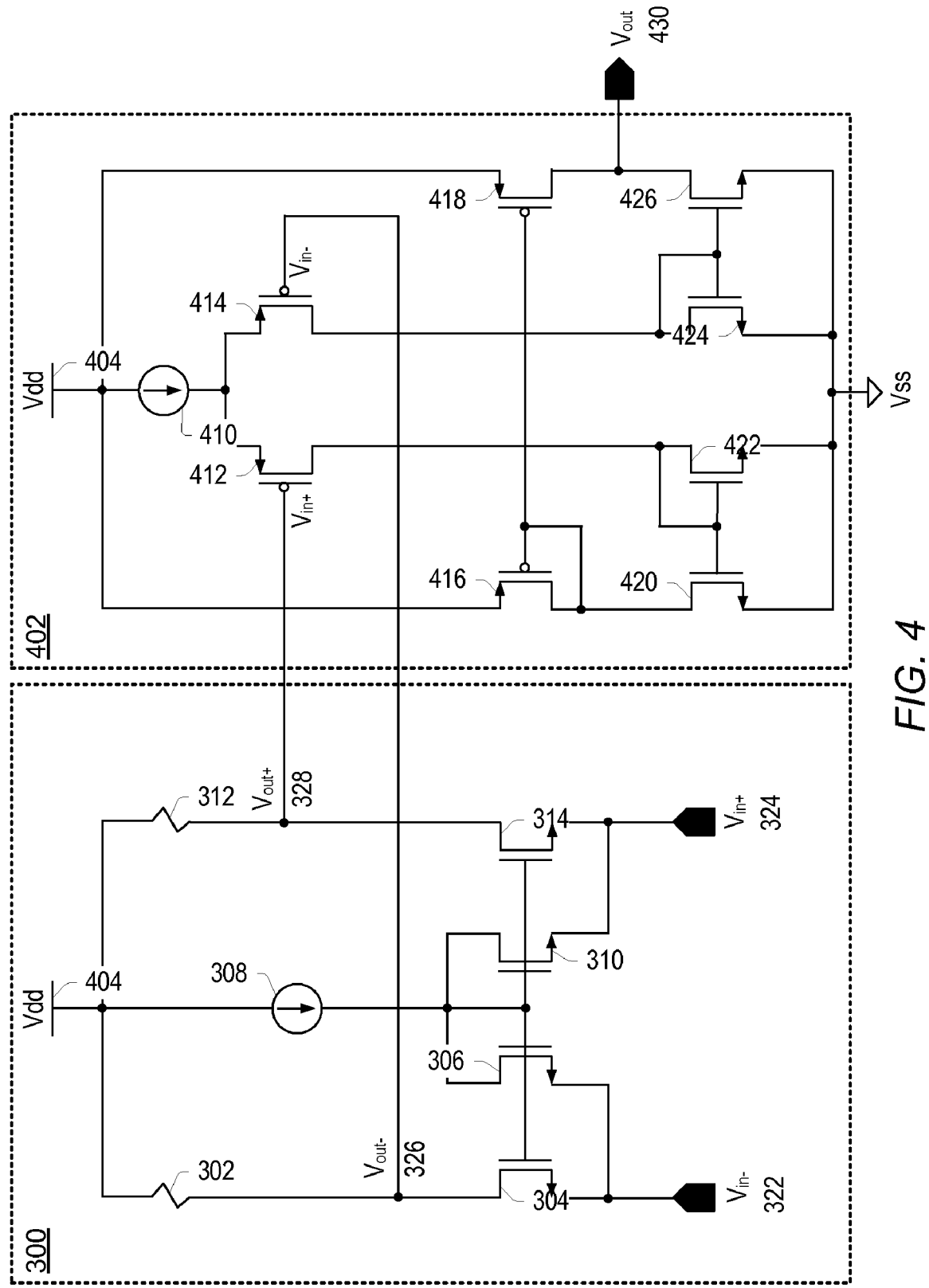
FIG. 4 shows the first gain stage and the second gain stage of one embodiment of a comparator according to principles of the present invention.

First gain stage 300 may be combined with a second stage 402 to produce one embodiment of a low-offset comparator, as shown in FIG. 4. Second stage 402 may be a differential-input current mirror amplifier with a considerably larger gain than first gain stage 300. Second stage 402 may also be configured to perform differential to single-ended conversion, producing a single-ended voltage output $V_{out}$ 430 from a pair of differential inputs applied to respective gate terminals of PMOS devices 412 and 414, which may be coupled as a common-source differential pair. In this embodiment, the pair of differential outputs $V_{out-}$ 326 and $V_{out+}$ 328 from first gain stage 300 is coupled to the pair of gate terminals of PMOS device 414 and PMOS device 412, respectively. NMOS devices 422 and 424 may be diode-connected and coupled as load devices for the common-source differential pair NMOS devices 412 and 414.

NMOS device 420 may have its gate terminal and source terminal coupled to the gate terminal and source terminal, respectively, of NMOS device 422 to obtain a current-mirror, whereby the current conducted by NMOS device 420 may reflect the current conducted by NMOS device 422 (subject to the size ratio of the two devices, of course). Similarly, NMOS device 426 may have its gate terminal and source terminal coupled to the gate terminal and source terminal, respectively, of NMOS device 424 to obtain a current-mirror, whereby the current conducted by NMOS device 426 may reflect the current conducted by NMOS device 424 (again, subject to the size ratio of the two devices). PMOS devices 416 and 418 may be configured as load devices for NMOS devices 420 and 426, respectively, with the current conducted by diode-connected PMOS device 416 mirrored in PMOS device 418, providing single-ended output $V_{out}$ 430 at the common-drain node of PMOS device 418 and NMOS device 426.

Figure 5:
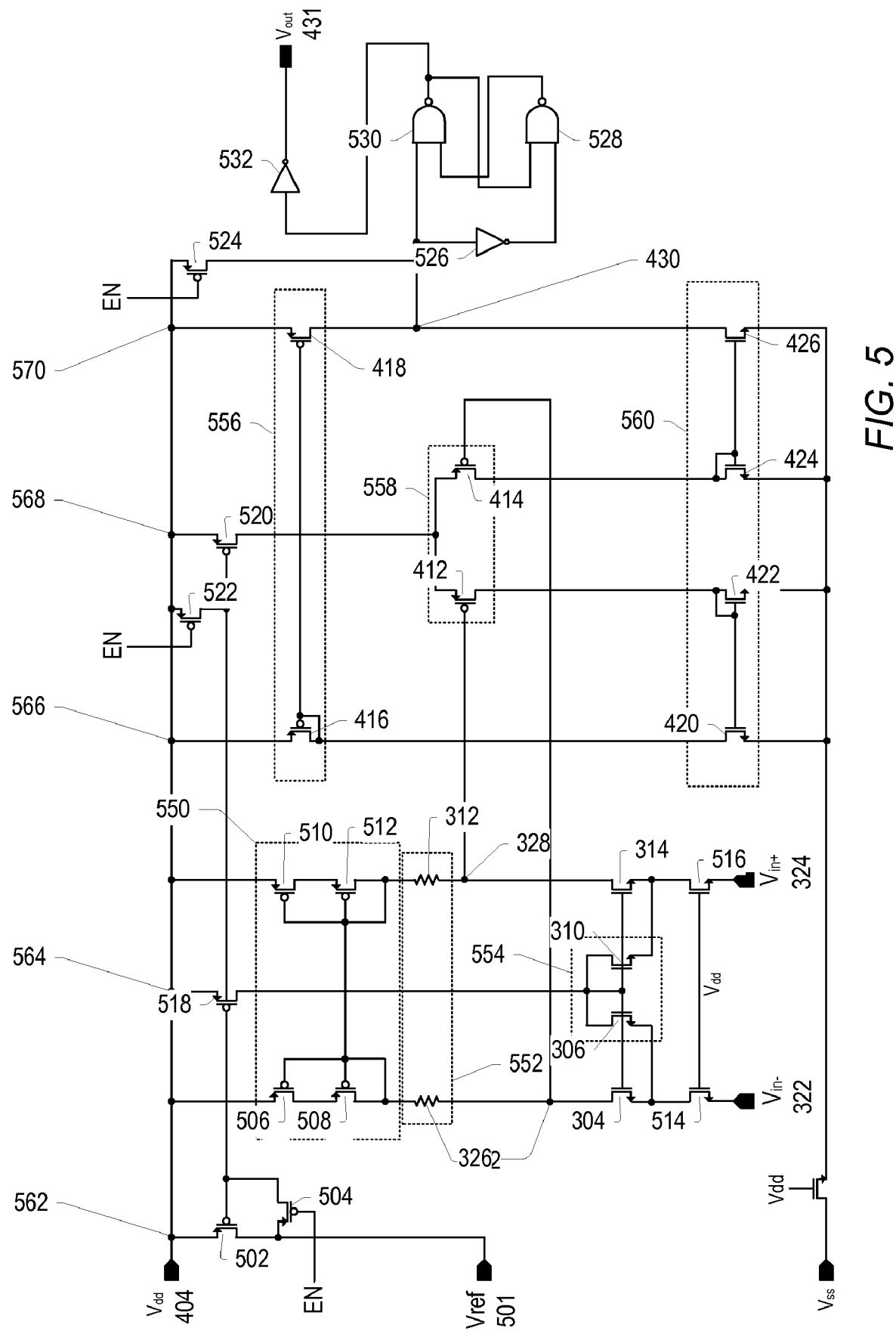
FIG. 5 shows the first gain stage, the second gain stage, and the output stage of one embodiment of a comparator according to principles of the present invention.

FIG. 5 shows one embodiment of a comparator comprising a modified embodiment of first gain stage 300, one embodiment of second gain stage 402, and a third stage implemented as a bistable SR latch. In the embodiment of the comparator in FIG. 5, the first stage may be a fully differential common-gate amplifier, as also shown in FIGS. 3 and 4, this time configured with a self-biased cascode diode load 550 in conjunction with resistive load 552. Resistive load 552 may comprise resistors 302 and 312, while diode load 550 may include cascode diode-connected PMOS devices 506 and 508 presenting a load at output node 326 ($V_{out-}$ 326) of the first stage, and cascode diode-connected PMOS devices 510 and 512 presenting a load at output node 328 ($V_{out+}$ 328) of the first stage. Differential inputs $V_{in-}$ 322 and $V_{in+}$ 324 of the comparator may be coupled to the respective source terminals of NMOS devices 306 and 310 via NMOS devices 514 and 516, respectively, with NMOS devices 514 and 516 acting as current followers with their respective gates tied to supply voltage $V_{dd}$ 404. Current source 308 (from FIGS. 3 and 4) may be implemented using PMOS device 518 mirroring current flowing in PMOS device 502 whose drain may be coupled to a reference voltage Vref 501. Each stage may be independently enabled, with PMOS device 504 configured to enable the first stage, PMOS device 522 configured to enable the second stage, and PMOS device 524 configured to enable the third stage SR latch. In one embodiment, a common enable signal 'EN' may be coupled to the respective gate terminals of PMOS devices 504, 522, and 524, simultaneously enabling all three stages of the comparator.

Cascode diode load 550 may operate to reject noise that might be present on power supply rail $V_{dd}$ 404, while the fully differential (i.e. differential inputs and differential outputs) circuit topology of the first stage allows for common-mode noise rejection at inputs $V_{in-}$ 322 and $V_{in+}$ 324, which may be important for the first stage. In one set of embodiments, the total power consumption of the first stage may be 10 μA. The pair of differential outputs 326 and 328 may be coupled to the gate terminals of common-source differential pair 558, which may comprise PMOS input devices 414 and 412, respectively. PMOS devices 412 and 414 may operate as the input stage of the second gain stage of the comparator, where the second gain stage is configured as a current-mirror amplifier (as also shown in FIG. 4) operable to perform differential to single-ended conversion, generating a single output voltage signal 430.

Diode-connected NMOS devices 422 and 424 may be configured as active load devices for common-source differential pair 558, with NMOS devices 420 and 426 configured as mirror devices for NMOS devices 422 and 424, respectively. Again, the current conducted by diode-connected PMOS device 416 may be mirrored in PMOS device 418, providing single-ended output $V_{out}$ 430 at the common-drain node of PMOS device 418 and NMOS device 426. Current source 410 (from FIG. 4) may be implemented by configuring PMOS device 520 to mirror current flowing in PMOS device 502, whose drain may be coupled to reference voltage Vref 501. In the embodiment shown, the fully differential structure in the second stage is maintained until the differential to single-ended conversion stage using PMOS pair 556 (PMOS devices 416 and 418.) In order to increase the overall bandwidth of the comparator, the second stage may be configured to have a power consumption that is a multiple of the power consumption of the first stage. For example, if the power consumption of the first stage is 10 μA, the second stage may be configured to have a power consumption of 60 μA.

In one set of embodiments, and as shown in FIG. 5, in order to further increase overall gain and response time of the comparator, in addition to avoid potential multiple switching, a bistable latch, for example an SR latch, may be coupled to single-ended output $V_{out}$ 430 as an output stage. The SR latch may comprise cross-coupled NAND gates 528 and 530, with inverters 526 and 532 matching the assertion levels of the inputs of the SR latch and correcting the assertion level of the output of the SR latch, respectively. The gain of the first stage may be obtained using equation 1, and multiplied with the gain of the second stage to obtain the overall gain of the comparator. In one set of embodiments, the first stage may be configured to have a gain of 20, and the second stage may be configured to have a gain of 100, resulting in an overall gain of 2000. The high overall gain of 2000 obtained in two stages, in conjunction with the differential inputs applied at the respective source terminals of common-gate input stage 554 of the first stage results in a fast (e.g. 20-50 ns decision time), accurate, and low offset (e.g. 3 mV) comparator that can sense ground level.

Figure 6:
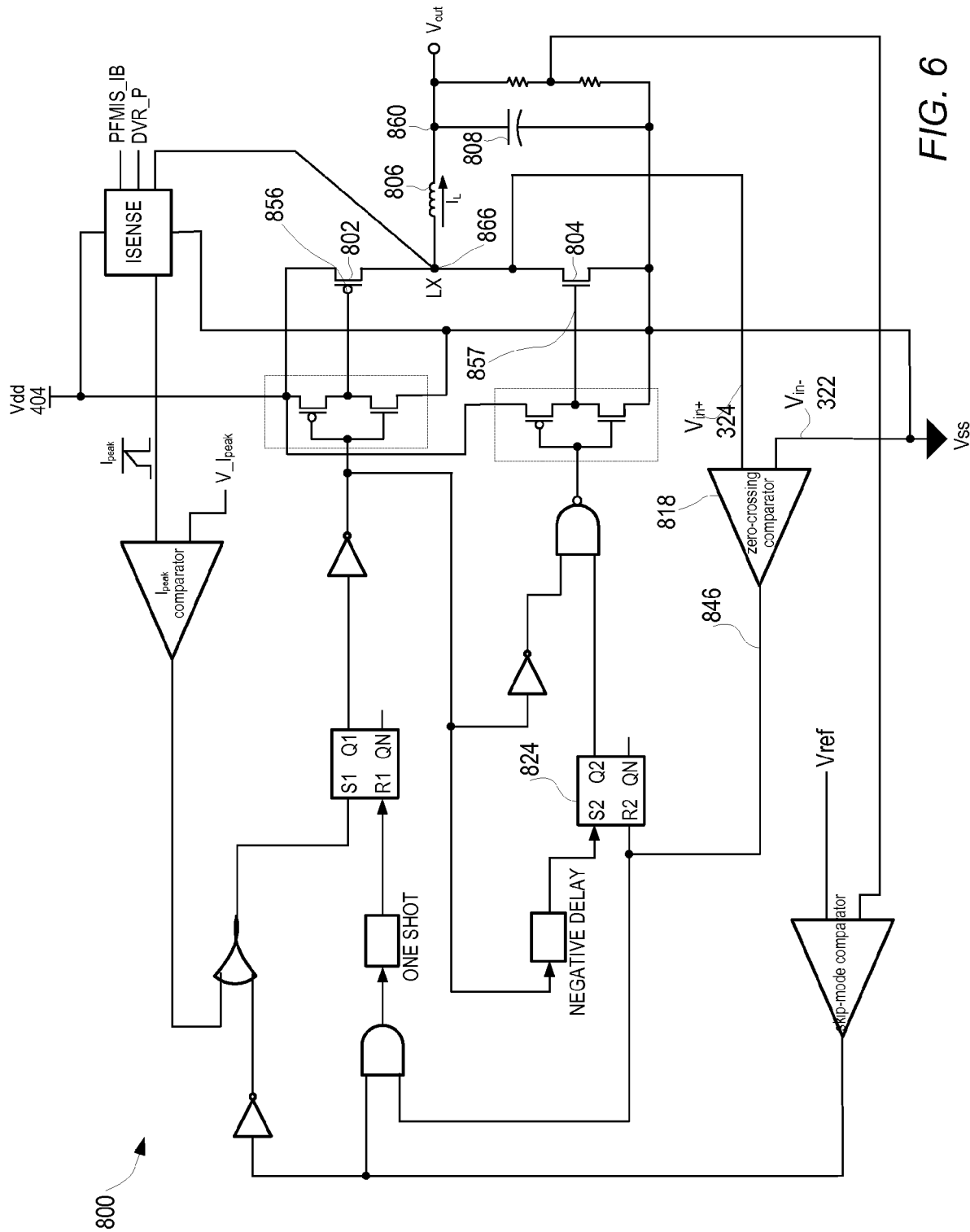
FIG. 6 shows an exemplary switching power regulator configured with a zero-crossing comparator designed according to principles of the present invention.

Various embodiments of the comparator described above may be ideally configured in switching power-regulators operating in pulse-frequency modulation (PFM) mode, which typically require a fast, accurate comparator that can sense ground level. One example of such a switching DC-DC power-regulator 800 is shown in FIG. 6, in reference to U.S. patent application Ser. No. 11/380,508 titled "Pulse-Frequency Mode DC-DC Converter Circuit" filed on Apr. 27, 2006, whose inventor is Daniel Ho, and which is hereby incorporated by reference as though fully and completely set forth herein. It should be noted that power regulator 800 is shown only to provide a context and an example of the use for the various embodiments of comparators designed according to principles of the present invention, and is in no way meant to limit the use of such comparators to power regulator 800. Those skilled in the art will appreciate that various embodiments of the comparators may be used in a variety of other systems, circuits, and/or applications that may call for the use of a comparator or comparators.

FIG. 6 shows a switching power regulator 800 built around switching output transistor devices 802 and 804. Node 866 is configured as the intermediate output node of switching regulator 800, with an inductor 806 to smooth out the output waveform and capacitor 808 providing a load. Node 860 may thereby be configured as the effective regulated voltage output of switching power regulator 800. When operating in PFM mode, zero-crossing comparator 818 may be used to sense when the output at node 866 crosses the zero voltage threshold. In this embodiment, comparator 818 may be one embodiment of a multi-gain-stage comparator as previously described, with a first one of the pair of differential inputs, $V_{in+}$ 324, coupled to node 866, and the other one of the pair of differential inputs, $V_{in-}$ 322, coupled to Vss. As shown in FIG. 6, comparator 818 may provide a single-ended output 846 to partially control SR latch 824. PMOS output device 802 may be controlled through its gate terminal 856, and NMOS output device 804 may be controlled through its gate terminal 857.

Figure 7:
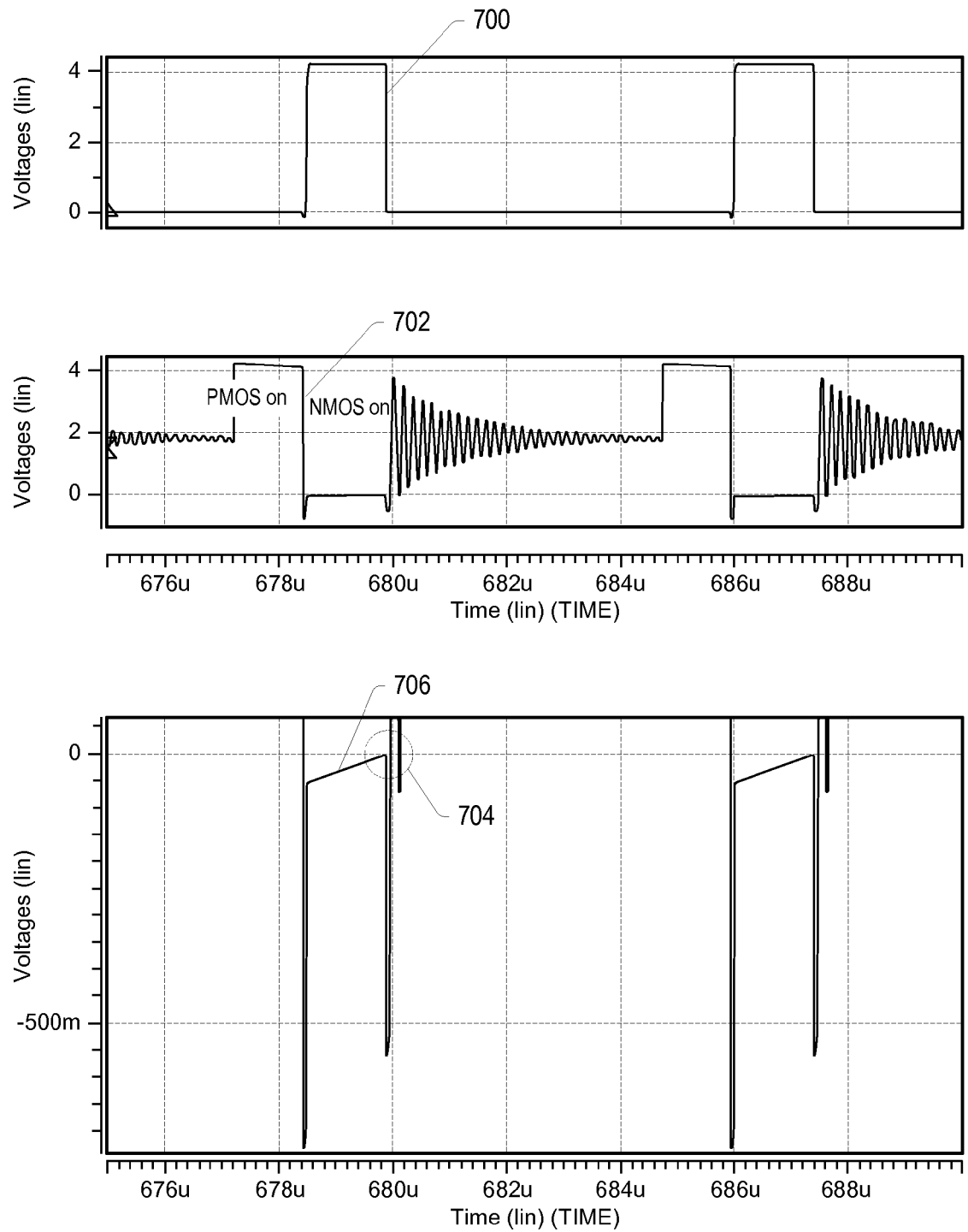
FIG. 7 shows voltage waveforms highlighting the operation of the switching power regulator and the zero-crossing comparator of FIG. 6.

FIG. 7 shows voltage waveforms obtained during simulations of switching power regulator 800, highlighting the operation of comparator 818 according to one embodiment of the present invention. Voltage waveform 700 represents the input control voltage at node 857 (in FIG. 6), with the output voltage at node 866 (in FIG. 6) represented by voltage waveform 702. As seen in FIG. 7, once it is settled, the output at node 866 is asserted (goes to a high state in this case) when the input control voltage is deasserted (low in this case), and indicates that PMOS device 802 is turned on. When the input control voltage is asserted (goes to a high voltage state in this case), the output at node 866 is deasserted (goes low in this case), and indicates that NMOS device 804 is turned on. Waveform 706 is a magnified version of waveform 702, showing in detail the behavior of the output at node 866 resulting from comparator 818 sensing when the output at node 866 crosses zero. As indicated by selected area 704, the operation of comparator 818 shows a fast response and a low offset, approximately 3 mV in this embodiment.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

What is claimed is:

1. A comparator having first and second inputs, the comparator comprising:
   a first-stage amplifier having a pair of first differential outputs, and a pair of first differential inputs coupled to the first and second inputs of the comparator, wherein the first-stage amplifier has a low input impedance, wherein the first-stage amplifier comprises a first pair of transistor devices having a first common gate node and forming a differential input stage, wherein the pair of first differential inputs are formed by respective source terminals of the first pair of transistor devices, wherein the first pair of transistor devices are diode-connected transistors; and
   a second-stage amplifier having a pair of second differential inputs coupled to the pair of first differential outputs of the first-stage amplifier, wherein the second-stage amplifier is operable to generate a single-ended output, and has a higher gain then the first-stage amplifier;
   wherein the single-ended output of the second-stage amplifier is used to produce an output of the comparator.

2. The comparator of claim 1, further comprising a bistable latch having a first input coupled to the single-ended output of the second-stage amplifier, a second input coupled to an inverted version of the single-ended output of the second-stage amplifier, and an output used to produce the output of the comparator.

3. The comparator of claim 1, wherein the first-stage amplifier further comprises:
   a common-gate differential pair of current mirrors, each current mirror having an input and an output, and a second common gate node coupled to the first common gate node and configured to receive a first current, wherein each current mirror input is coupled to a respective one of the pair of first differential inputs to develop current in the current mirror to which the current mirror input corresponds, according to a relative voltage between the pair of first differential inputs.

4. The comparator of claim 3, wherein the first-stage amplifier further comprises a current source configured to generate the first current, wherein the first current is constant.

5. The comparator of claim 4, wherein the first-stage amplifier further comprises:
   a first load circuit coupled to the output of one of the pair of current mirrors to develop a voltage at the output of the one of the pair of current mirrors according to a current conducted by the one of the pair of current mirrors; and
   a second load circuit coupled to the output of the other one of the pair of current mirrors to develop a voltage at the output of the other one of the pair of current mirrors according to a current conducted by the other one of the pair of current mirrors.

6. The comparator of claim 1, wherein the second-stage amplifier comprises a first pair of transistor devices forming a differential input stage having a pair of second differential outputs, the first pair of transistor devices having a first common source node configured to receive a first current, wherein the pair of second differential inputs are formed by respective gate terminals of the first pair of transistor devices.

7. The comparator of claim 6, wherein the second-stage amplifier further comprises a current source configured to generate the first current, wherein the first current is constant.

8. The comparator of claim 7, wherein the second-stage amplifier further comprises a first pair of load circuits, each load circuit of the first pair of load circuits coupled to a respective one of the pair of second differential outputs to develop a respective voltage at the respective one of the pair of second differential outputs to which the load circuit is coupled, according to a current flowing in the respective one of the pair of second differential outputs to which the load circuit is coupled.

9. The comparator of claim 8, wherein the second-stage amplifier further comprises a common-source differential pair of current mirrors, each current mirror having an input and an output, and a common source node coupled to ground, wherein each current mirror input is coupled to a respective one of the pair of second differential outputs to develop current in the current mirror to which the current mirror input corresponds, according to a relative voltage between the pair of second differential outputs.

10. The comparator of claim 9, wherein the second-stage amplifier further comprises a second pair of load circuits, wherein one of the second pair of load circuits is coupled to the output of one of the pair of current mirrors and the other one of the second pair of load circuits is coupled to the output of the other one of the pair of current mirrors;
    wherein the one of the second pair of load circuits is configured to mirror a current conducted in the other one of the second pair of load circuits to develop the 15 single-ended output from the pair of second differential outputs.

11. A comparator having first and second inputs, the comparator comprising:

a differential common-gate amplifier comprising a resistive and self-biased cascode diode load, and having a pair of differential outputs and a pair of differential inputs, the differential inputs respectively coupled to the first and second inputs of the comparator, said differential common gate amplifier comprising:

a first pair of transistor devices having a first common gate node and forming a differential input stage, wherein the pair of differential inputs are formed by respective source terminals of the first pair of transistor devices, wherein the first pair of transistor devices are diode-connected transistors; and a current-mirror amplifier having a pair of differential inputs coupled to the pair of differential outputs of the differential common-gate amplifier, and operable to perform differential to single-ended conversion to produce a single-ended output;

wherein a gain of the current-mirror amplifier is a multiple of a gain of the differential common-gate amplifier; and wherein the single-ended output of the current-mirror amplifier is used to produce an output of the comparator.

12. The comparator of claim 11 further comprising a bistable digital circuit having a pair of inputs coupled to the single-ended output of the current-mirror amplifier and an output configured to provide a logic value representing a state of the comparator.

* * * * *